(12) United States Patent
Preuss et al.

(10) Patent No.: US 11,486,042 B2
(45) Date of Patent: Nov. 1, 2022

(54) SILICON COATING ON HARD SHIELDS

(71) Applicant: VIAVI SOLUTIONS INC., San Jose, CA (US)

(72) Inventors: Adam Andrew Preuss, Santa Rosa, CA (US); Richard A. Bradley, Jr., Santa Rosa, CA (US); Georg J. Ockenfuss, Santa Rosa, CA (US); Markus K. Tilsch, Santa Rosa, CA (US); Andrew Clark, Santa Rosa, CA (US); Marius Grigonis, Santa Rosa, CA (US); Andy Shkabko, Santa Rosa, CA (US); Nicolas Alexander Davis, Santa Rosa, CA (US); Anthony Jay Kemp Cottrell, Santa Rosa, CA (US)

(73) Assignee: VIAVI SOLUTIONS INC., San Jose, CA (US)

( * ) Notice: Subject to any disclaimer, the term of this patent is extended or adjusted under 35 U.S.C. 154(b) by 501 days.

(21) Appl. No.: 16/250,842

(22) Filed: Jan. 17, 2019

(65) Prior Publication Data
US 2019/0218669 A1      Jul. 18, 2019

Related U.S. Application Data

(60) Provisional application No. 62/619,052, filed on Jan. 18, 2018.

(51) Int. Cl.
*C23C 28/00* (2006.01)
*C23C 4/131* (2016.01)
(Continued)

(52) U.S. Cl.
CPC ............ *C23C 28/34* (2013.01); *B32B 15/012* (2013.01); *B32B 15/013* (2013.01);
(Continued)

(58) Field of Classification Search
CPC ... C23C 30/00; C23C 30/005; C23C 16/0281; C23C 16/24; C23C 16/513; C23C 16/12;
(Continued)

(56) References Cited

U.S. PATENT DOCUMENTS 4,427,516 A      1/1984 Levinstein et al.
5,075,187 A  *  12/1991 Karakida ............. G03G 5/0433
                                                                    430/57.4
(Continued)

FOREIGN PATENT DOCUMENTS

JP      H01124863 A      5/1989
JP      H01-224772 A     9/1989
(Continued)

OTHER PUBLICATIONS

Vijay A. Sethuraman et al., "Increased cycling efficiency and rate capability of copper-coated silicon anodes in lithium-ion batteries", Journal of Power Sources, vol. 196, No. 1, 2011, 15 pages.

*Primary Examiner* — Michael E. La Villa
(74) *Attorney, Agent, or Firm* — Mannava & Kang, P.C.

(57) ABSTRACT

A device including a hard shield material; a layer including aluminum or copper; and a silicon layer having a first thickness is disclosed. The device can also include a silicon layer having a second thickness. A method of making the device is also disclosed.

20 Claims, 4 Drawing Sheets

(51) Int. Cl.

| | |
|---|---|
| *C23C 4/08* | (2016.01) |
| *C23C 4/134* | (2016.01) |
| *C23C 4/067* | (2016.01) |
| *C23C 14/16* | (2006.01) |
| *C23C 14/34* | (2006.01) |
| *C23C 4/06* | (2016.01) |
| *C23C 16/02* | (2006.01) |
| *H01J 37/32* | (2006.01) |
| *C23C 16/24* | (2006.01) |
| *C23C 28/02* | (2006.01) |
| *C23C 16/513* | (2006.01) |
| *B32B 15/04* | (2006.01) |
| *H01J 37/34* | (2006.01) |
| *H01L 23/552* | (2006.01) |
| *C23C 30/00* | (2006.01) |
| *C23C 4/10* | (2016.01) |
| *B32B 15/18* | (2006.01) |
| *B32B 15/01* | (2006.01) |
| *B32B 15/20* | (2006.01) |
| *C23C 16/12* | (2006.01) |
| *C23C 4/04* | (2006.01) |

(52) U.S. Cl.
CPC ............ *B32B 15/015* (2013.01); *B32B 15/04* (2013.01); *B32B 15/043* (2013.01); *B32B 15/18* (2013.01); *B32B 15/20* (2013.01); *C23C 4/04* (2013.01); *C23C 4/06* (2013.01); *C23C 4/067* (2016.01); *C23C 4/08* (2013.01); *C23C 4/10* (2013.01); *C23C 4/131* (2016.01); *C23C 4/134* (2016.01); *C23C 14/165* (2013.01); *C23C 14/34* (2013.01); *C23C 16/0281* (2013.01); *C23C 16/12* (2013.01); *C23C 16/24* (2013.01); *C23C 16/513* (2013.01); *C23C 28/023* (2013.01); *C23C 28/30* (2013.01); *C23C 28/32* (2013.01); *C23C 28/322* (2013.01); *C23C 30/00* (2013.01); *C23C 30/005* (2013.01); *H01J 37/32477* (2013.01); *H01J 37/3411* (2013.01); *H01L 23/552* (2013.01); *Y10T 428/12451* (2015.01); *Y10T 428/12472* (2015.01); *Y10T 428/12639* (2015.01); *Y10T 428/12674* (2015.01); *Y10T 428/12757* (2015.01); *Y10T 428/12917* (2015.01); *Y10T 428/12924* (2015.01); *Y10T 428/12951* (2015.01); *Y10T 428/12972* (2015.01); *Y10T 428/12979* (2015.01); *Y10T 428/12993* (2015.01); *Y10T 428/2495* (2015.01); *Y10T 428/24959* (2015.01); *Y10T 428/24967* (2015.01); *Y10T 428/24975* (2015.01); *Y10T 428/26* (2015.01); *Y10T 428/263* (2015.01); *Y10T 428/264* (2015.01); *Y10T 428/265* (2015.01)

(58) Field of Classification Search
CPC .. C23C 4/06; C23C 4/131; C23C 4/08; C23C 4/067; C23C 4/165; C23C 4/134; C23C 4/10; C23C 28/34; C23C 28/023; C23C 28/322; C23C 28/30; C23C 28/32; C23C 14/34; C23C 4/04; C23C 14/165; H01L 23/552; B32B 15/04; B32B 15/043; B32B 15/012; B32B 15/013; B32B 15/18; B32B 15/20; B32B 15/015; H01J 37/3411; H01J 37/32477; Y10T 428/12472; Y10T 428/12451; Y10T 428/12951; Y10T 428/12674; Y10T 428/12757; Y10T 428/12917; Y10T 428/12924; Y10T 428/12639; Y10T 428/12972; Y10T 428/12979; Y10T 428/12993; Y10T 428/2495; Y10T 428/24967; Y10T 428/24959; Y10T 428/24975; Y10T 428/26; Y10T 428/263; Y10T 428/264; Y10T 428/265

See application file for complete search history.

(56) References Cited

U.S. PATENT DOCUMENTS

| | | |
|---|---|---|
| 5,082,760 A | 1/1992 | Fukuda et al. |
| 6,123,999 A | 9/2000 | Felix et al. |
| 2012/0321812 A1 | 12/2012 | Vanek et al. |
| 2017/0090339 A1* | 3/2017 | Iwanaga .............. G03G 5/0436 |
| 2017/0145553 A1 | 5/2017 | Liu et al. |

FOREIGN PATENT DOCUMENTS

| | | |
|---|---|---|
| JP | 2002-292346 | 10/2002 |
| JP | 2005-521868 | 7/2005 |
| WO | WO 2016/131024 | * 8/2016 |

* cited by examiner

SILICON COATING ON HARD SHIELDS

RELATED APPLICATIONS

The present application claims priority to U.S. Provisional Application No. 62/619,052, filed Jan. 18, 2018, the disclosure of which is hereby incorporated by reference.

FIELD OF THE INVENTION

The present disclosure generally relates to a device including a hard shield material; a layer including aluminum or copper; and a silicon layer having a first thickness. The device can also include a silicon layer having a second thickness. A method of making the device is also disclosed. The device can include less defects and can have increased durability.

BACKGROUND OF THE INVENTION

Excess coating material can attach to the walls of the sputter coating chamber. The coating on the walls of the sputter chamber can fracture, fall apart, and can create dust. Each cycle of use of the sputter coating chamber increases the number and types of defects that can be seen in the coatings deposited in the coating chamber. The increased number of defects results in a decreased yield, which leads to a lower throughput through the coating chamber, which leads to lower capacity.

SUMMARY OF THE INVENTION

In an aspect, there is disclosed a device including a hard shield material; a layer including aluminum or copper; and a silicon layer.

In another aspect, there is disclosed a method of making a device comprising providing a hard shield material; applying on top of the hard shield material a layer using a twin wire arc spray process; and applying on top of the layer applied using the twin wire arc spray process a silicon layer having a first thickness using a plasma spray process.

Additional features and advantages of various embodiments will be set forth, in part, in the description that follows, and will, in part, be apparent from the description, or may be learned by the practice of various embodiments. The objectives and other advantages of various embodiments will be realized and attained by means of the elements and combinations particularly pointed out in the description herein.

BRIEF DESCRIPTION OF THE DRAWINGS

The present disclosure in its several aspects and embodiments can be more fully understood from the detailed description and the accompanying drawings, wherein.

Throughout this specification and figures like reference numbers identify like elements.

DETAILED DESCRIPTION OF THE INVENTION

It is to be understood that both the foregoing general description and the following detailed description are exemplary and explanatory only, and are intended to provide an explanation of various embodiments of the present teachings. The layers/components shown in each Figure may be described with regard to a particular Figure, but it is understood that the description of a particular layer/component would be applicable to the equivalent layer/component in the other Figures.

Figure 1:
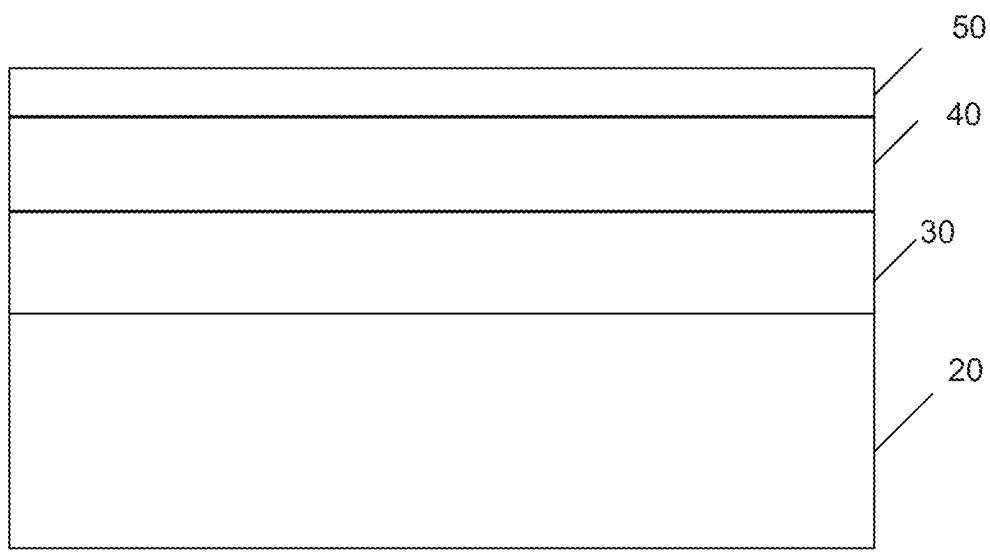
FIG. 1 is a cross-section of a device according to an aspect of the invention.
Figure 2A:
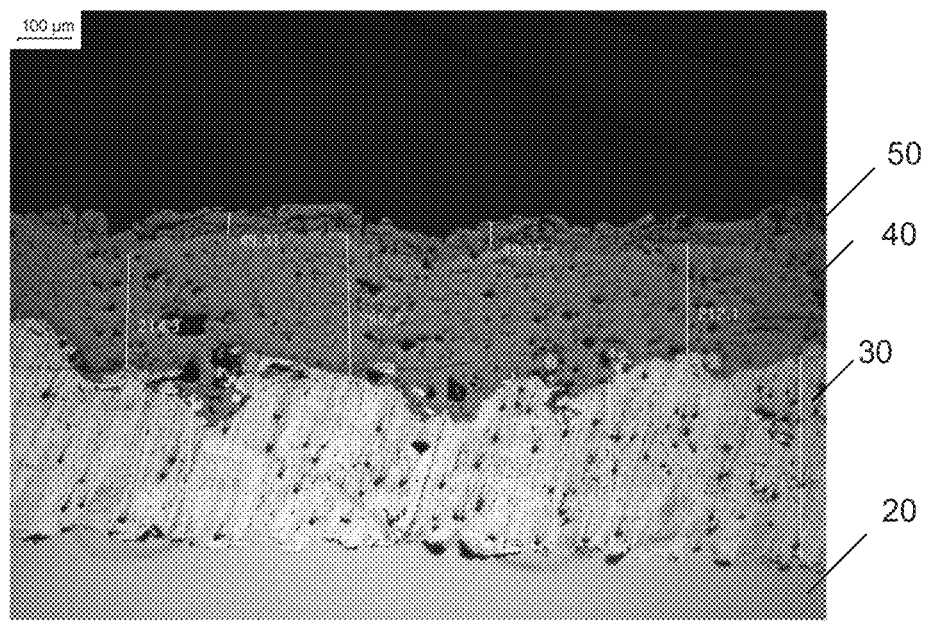
FIGS. 2A and 2B are images of a device according to an aspect of the invention.
Figure 2B:
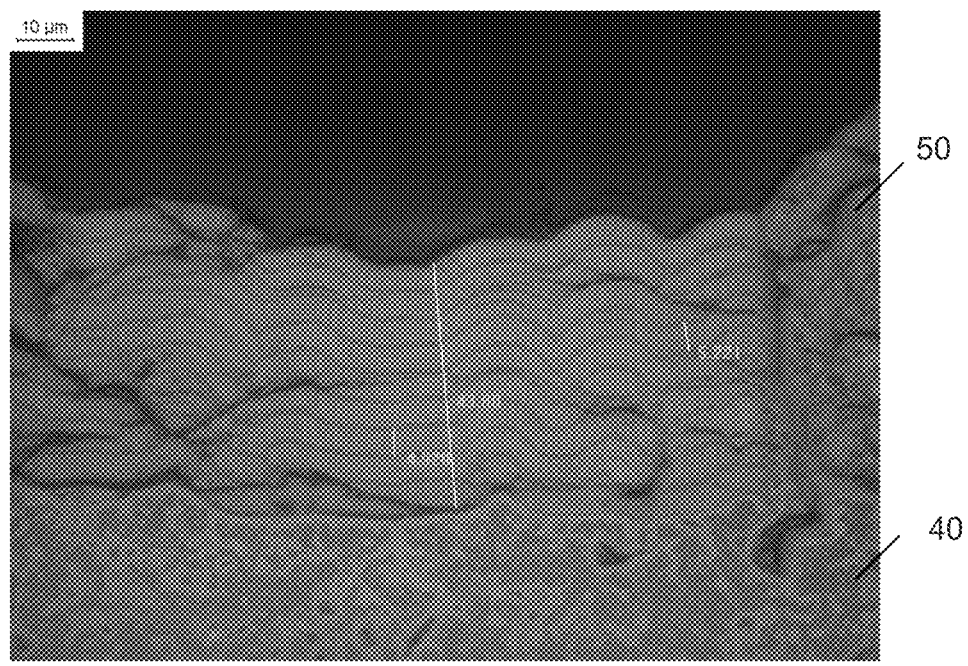
Figure 3A:
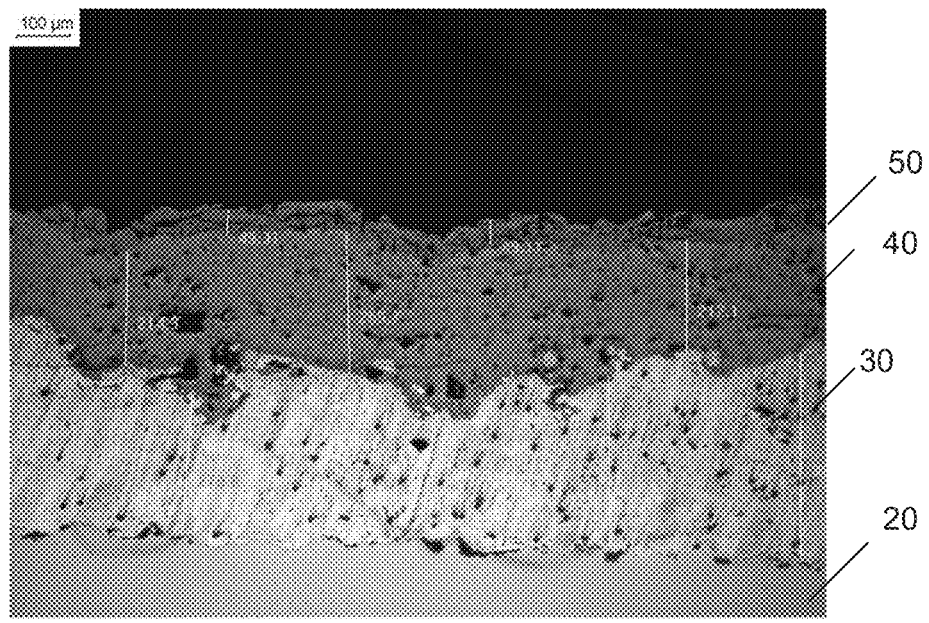
FIGS. 3A and 3B are images of a device according to an aspect of the invention.
Figure 3B:
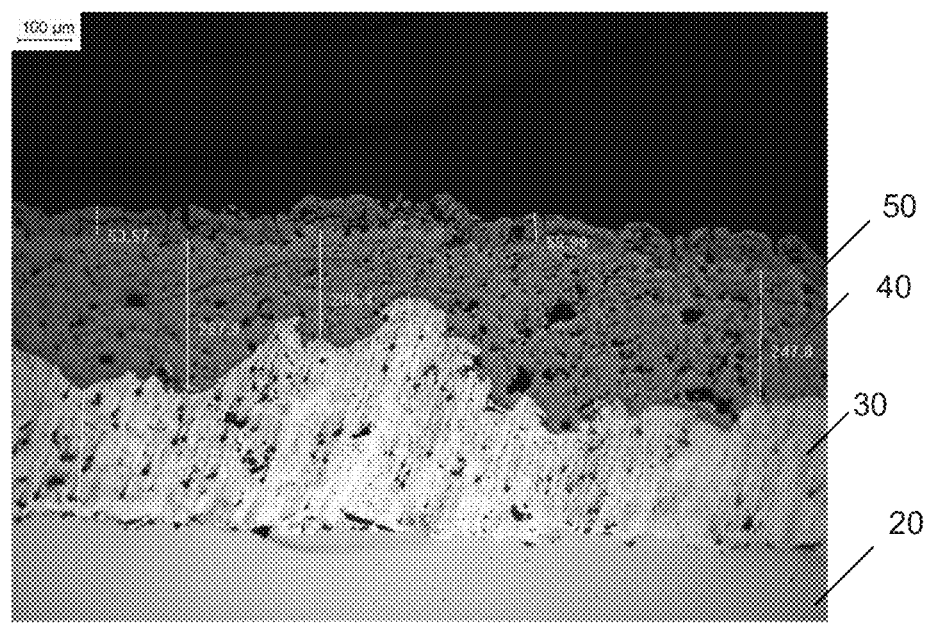
Figure 4A:
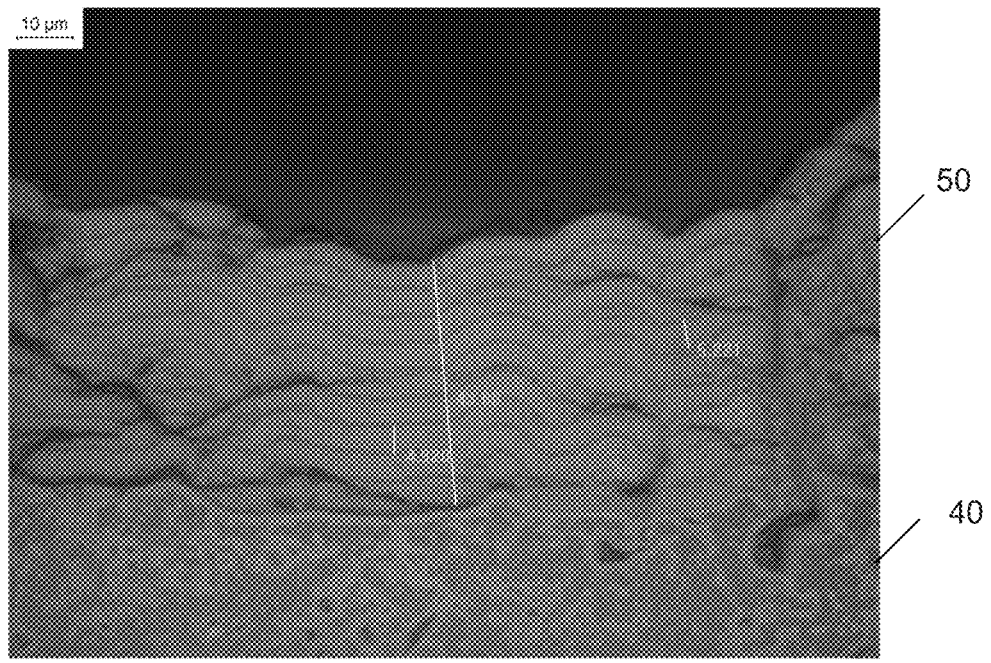
FIGS. 4A and 4B are images of a device according to an aspect of the invention.
Figure 4B:
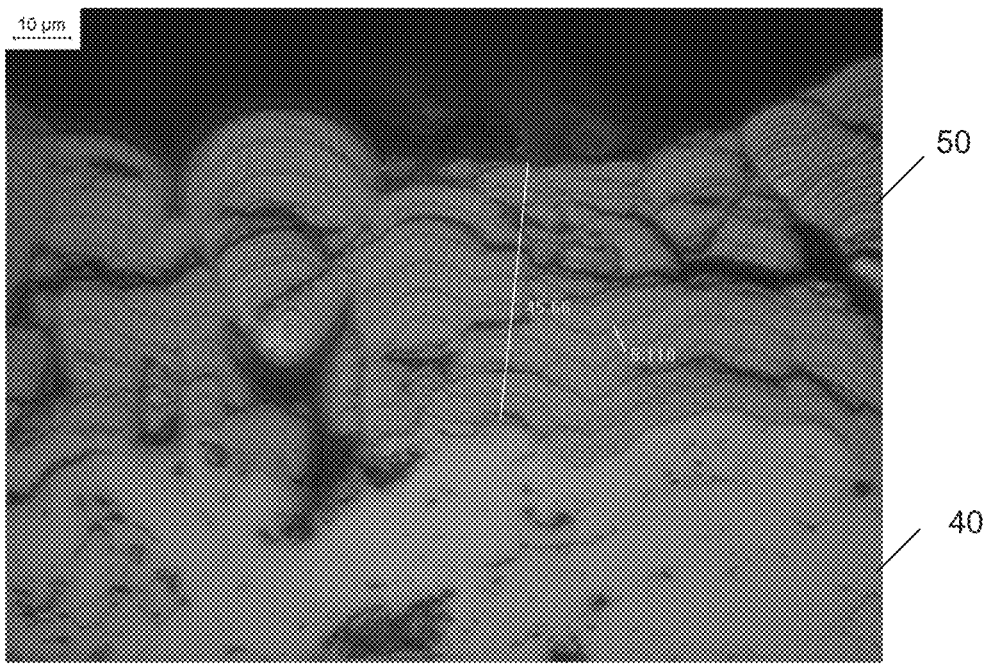

In its broad and varied embodiments, disclosed herein is a device 10 including a hard shield material 20; a layer 30 including aluminum or copper; and a silicon layer 40 having a first thickness. As shown in FIG. 1, the device can include a hard shield material 20; a layer 30 including aluminum or copper; a silicon layer 40 having a first thickness; and a silicon layer 50 having a second thickness. FIGS. 2A-4B are images of a device as shown in FIG. 1.

The hard shield material 202 can be any suitable substrate material. In an aspect, the hard shield material 20 can a metal. As used herein, the term "metal" refers to an element of Groups 2 through 13, inclusive, plus selected elements in Groups 14 and 15 of the periodic table. Thus, the term "metal" broadly refers to the following elements:

Group 2 or IIA: beryllium (Be), magnesium (Mg), calcium (Ca), strontium (Sr), barium (Ba), and radium (Ra).

Groups 3-12: transition metals (Groups IIIB, IVB, VB, VIB, VIIB, VIII, IB, and IIB), including scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os) cobalt (Co), rhodium (Rh), iridium (Ir), nickel (Ni), palladium (Pd), platinum (Pt), copper (Cu), silver (Ag), gold (Au), zinc (Zn), cadmium (Cd), and mercury (Hg).

Group 13 or IIIA: boron (B), aluminum (Al), gallium (Ga), indium (In), and thallium (Tl).

Lanthanides: lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Group 14 or IVA: germanium (Ge), tin (Sn), and lead (Pb).

Group 15 or VA: antimony (Sn) and bismuth (Bi).

In an aspect, the hard shield material 20 can be steel, such as stainless steel, or aluminum. The hard shield material 20 can have a thickness ranging from about 1 mm to about 5 mm, such as from about 2 mm to about 4 mm, and as a further example about 3 mm thick. It is contemplated that any thickness within the disclosed ranges can be used as well.

In the disclosed device 10, a layer 30 including aluminum or copper can be applied on top of the hard shield material 20. The layer 30 can be a roughened metal, such as a roughened layer of aluminum or a roughened layer of copper. In an aspect, this layer 30 can be applied using a twin wire arc spray process. The twin wire arc spray process can include various steps, such as: (A) providing a reaction chamber with at least one starting material selected from the group consisting of a metal, a metal alloy, a metal compound, and a ceramic; (B) operating a twin-wire arc nozzle, comprising two wires and a working gas being controllably fed into the chamber, to form an arc between two converging leading tips of the two wires to heat and melt the starting material at the leading tips for providing a stream of liquid droplets traveling in a predetermined direction; and (C) operating a high energy source for producing a vaporizing zone adjacent to the arc and inside the chamber wherein the liquid droplets are vaporized to form vapor species. The two wires can be continuously fed into the chamber with the leading tips of the wires continuously melted (and partially vaporized) at a high feeding rate for producing vapor material continuously without interruption and at a high throughput rate. The vapor material can impinge upon and deposit onto the hard shield material, such as the substrate, to form a thin film or coating. The temperature in the vicinity of the substrate surface can be regulated so that the vapor material condenses and forms a coating, such as a coating of aluminum or copper.

The working gas can be selected from, for instance, hydrogen, oxygen, carbon, nitrogen, chlorine, fluorine, boron, and sulfur to form respectively metal hydrides, oxides, carbides, nitrides, chlorides, fluorides, borides, and sulfides and combinations thereof.

The starting material could include two different materials in a wire. The two different materials could make up the two wires in such a fashion that the two wires have different material compositions.

The two metal wires can be driven by powered rollers to come in physical contact with two respective conductive jackets which are supplied with "+" and "−" voltage or pulsed power through electrically conductive blocks. The voltage polarity may be reversed; i.e., "−" and "+" instead of "+" and "−". The voltages can come from a DC or pulsed power source. The lower ends of the two wires can approach each other at an angle of approximately 30-60°. The two ends can be brought into contact with each other for a brief period of time. Such a "short circuit" contact can create an ultra-high temperature due to a high current density, leading to the formation of an ionized arc. A stable arc can be maintained provided that the current is constantly supplied, a certain level of gas pressure is maintained, and the wires are fed at a constant or pulsating speed. A stream of compressed air, introduced through a gas passage from a gas source (e.g., a compressed air bottle), can also serve to carry the stream of liquid downward into the vaporization zone.

The layer 30 including aluminum or copper can be applied on top of the hard shield material 20 at a thickness of about 0.001 mm to about 5 mm, for example from about 0.05 mm to about 4 mm, and as a further example from about 0.1 mm to about 3 mm. In an aspect, the layer 20 can be applied using a twin wire arc spray process to achieve a thickness of about 0.1 mm.

In the disclosed device 10, a silicon layer 40 having a first thickness can be applied onto the layer 30 including aluminum or copper. The silicon layer 40 can be applied using a plasma spray process. The plasma spray process can use a DC electric arc to generate a stream of high temperature (1500° C.) ionize plasma gas. A material, such as silicon, can be carried in an inert gas stream into the plasma jet where it is heated and propelled towards a substrate, such as the exposed layer of aluminum or copper that was applied on top of the hard shield material. The plasma spray gun can include a copper anode and tungsten cathode, both of which can be water cooled. Plasma gas, such as argon, nitrogen, hydrogen, and helium, can flow around the cathode and through the anode which can be shaped as a constricting nozzle.

The silicon layer 40 having a first thickness can be present at a first thickness of about 0.05 mm to about 2 mm, for example from about 0.08 mm to about 1.5 mm, and as a further example from about 0.1 mm to about 1 mm.

Stress and the defects resulting therefrom can occur due to the presence of dissimilar materials in relation to one another. For example, the layer 30 including aluminum or copper can produce stress and defects in the adjacent silicon layer 40 having a first thickness applied by a plasma spray process. However, these defects can be reduced or minimized due to the first thickness of the silicon layer 40. For example, the defects may only be present within 20 nm into the silicon layer 40 from the layer including the aluminum or copper. The defects therefore would not extend all the way through the silicon layer 40.

Additionally, the silicon layer 40 having a first thickness can have similar properties to a silicon layer 50 having a second thickness and applied via a sputter deposition process.

The device 10 can further include a silicon layer 50 having a second thickness that has been applied by a sputter deposition process onto the silicon layer 40 having a first thickness, which was applied by a plasma spray process. The silicon layer 50 can be present at a second thickness of from about 10 nm to about 100 nm, for example from about 30 nm to about 80 nm, and as a further example from about 45 nm to about 60 nm.

A method of making the device 10 can include providing a hard shield material 20; applying on top of the hard shield material 20 a layer 30 using a twin wire arc spray process; and applying on top of the layer 30 applied using the twin wire arc spray process a silicon layer 40 having a first thickness using a plasma spray process.

As discussed above, the hard shield material 20 can be any substrate material. In an aspect, the hard shield material 20 is steel or aluminum. The hard shield material 20 can be about 3 mm thick.

In an aspect, the layer 30 applied using the twin wire arc spray process is a layer of aluminum. In another aspect, the layer 30 applied using the twin wire arc spray process is a layer of copper. The layer 30 applied using the twin wire arc spray can have a thickness around 1 mm.

The silicon layer 40 having a first thickness applied using a plasma spray process can enable a thicker layer of silicon to be deposited. This silicon layer 40 can be applied in a layer thick enough to avoid and/or minimize the risk of defects occurring due to the presence of dissimilar materials. Additionally, because this thicker layer of silicon 40 is applied in a different process step it enables the sputter deposition of a silicon layer 50 having a second thickness to use less material, i.e., it is a thinner layer. The use of less material will reduce the likelihood that silicon would appear on the sputter coating chamber walls, falling off the walls, and creating dust on the device 10.

The method of making the device 10 further comprises, after applying a silicon layer 40 having a first thickness using a plasma spray process, applying a silicon layer 50 having a second thickness in a sputtering process. The silicon layer 50 applied in a sputtering process can be present in a thickness of about 50 nm.

The use of the two separate processes to apply the different thickness silicon layers 40, 50 can reduce defects in the resultant device 10, increase yield, increase throughput, and increase capacity. Additionally, the applied silicon layer can change a stress profile of the device. Further, the applied silicon layer can increase durability of the device.

EXAMPLES

Example 1—A device 10 was made as follows: A hard shield material 20 of stainless steel having a thickness of 3 mm was used as a substrate. A layer 30 of aluminum was applied onto the stainless steel sheet 20 using a twin wire arc spray process. The layer 30 of aluminum was 0.1 mm thick. A layer of silicon 40 having a first thickness was applied onto the layer 30 of aluminum using a plasma spray process. The layer of silicon 40 was 0.1 mm thick. A layer of silicon 50 having a second thickness was sputter deposited onto the plasma sprayed silicon layer 40 having a first thickness. The sputter deposited silicon layer 50 was 50 nm thick. FIGS. 2A-4B are images of the device made according to the method.

From the foregoing description, those skilled in the art can appreciate that the present teachings can be implemented in a variety of forms. Therefore, while these teachings have been described in connection with particular embodiments and examples thereof, the true scope of the present teachings should not be so limited. Various changes and modifications may be made without departing from the scope of the teachings herein.

This scope disclosure is to be broadly construed. It is intended that this disclosure disclose equivalents, means, systems and methods to achieve the devices, activities and mechanical actions disclosed herein. For each device, article, method, mean, mechanical element or mechanism disclosed, it is intended that this disclosure also encompass in its disclosure and teaches equivalents, means, systems and methods for practicing the many aspects, mechanisms and devices disclosed herein. Additionally, this disclosure regards a coating and its many aspects, features and elements. Such a device can be dynamic in its use and operation, this disclosure is intended to encompass the equivalents, means, systems and methods of the use of the device and/or article of manufacture and its many aspects consistent with the description and spirit of the operations and functions disclosed herein. The claims of this application are likewise to be broadly construed.

The description of the inventions herein in their many embodiments is merely exemplary in nature and, thus, variations that do not depart from the gist of the invention are intended to be within the scope of the invention. Such variations are not to be regarded as a departure from the spirit and scope of the invention.

We claim:

1. A device comprising:
   a metal substrate;
   a layer, on the metal substrate, of aluminum or copper; and
   a first silicon layer, on the layer of aluminum or copper, having a first thickness from 0.05 mm to 2 mm; and
   a second silicon layer, on the first silicon layer, having a second thickness from 10 nm to 100 nm.

2. The device of claim 1, wherein the metal substrate is chosen from the elements present in Groups 2 through 13 of the periodic table.

3. The device of claim 1, wherein the metal substrate is steel or aluminum.

4. The device of claim 1, wherein the metal substrate has a thickness ranging from about 1 mm to about 5 mm.

5. The device of claim 1, wherein the layer of aluminum or copper is roughened.

6. The device of claim 1, wherein the layer of aluminum or copper has a thickness of about 0.001 mm to about 5 mm.

7. The device of claim 1, wherein the metal substrate is steel.

8. The device of claim 1, wherein the second silicon layer is a sputter deposited layer.

9. The device of claim 1, wherein the second thickness is from 10 nm to about 60 nm.

10. A method of making a device, comprising:
    providing a metal substrate;
    applying on top of the metal substrate a layer of aluminum or copper using a twin wire arc spray process; and
    applying on top of the layer applied using the twin wire arc spray process a silicon layer having a first thickness of from 0.05 mm to 2 mm using a plasma spray process; and
    applying a second silicon layer on the first silicon layer, the second silicon layer having a second thickness of from 10 nm to 100 nm.

11. The method of claim 10, wherein the metal substrate is steel or aluminum.

12. The method of claim 10, wherein the layer applied using the twin wire arc spray process is a layer of aluminum.

13. The method of claim 10, wherein the layer applied using the twin wire arc spray process is a layer of copper.

14. The method of claim 10, wherein the second silicon layer is applied in a sputtering process.

15. The method of claim 14, wherein the second thickness is from 10 nm to about 60 nm.

16. The method of claim 10, wherein the applied silicon layer having a first thickness changes a stress profile of the device.

17. The method of claim 10, wherein the applied silicon layer having a first thickness increases durability of the device.

18. The method of claim 10, wherein the twin arc spray process includes providing a reaction chamber with at least one starting material selected from the group consisting of a metal, a metal alloy, a metal compound, and a ceramic.

19. The method of claim 18, wherein the twin arc spray process further includes operating a twin-wire arc nozzle comprising two wires and a working gas being controllably fed into the reaction chamber to form an arc between two converging leading tips of the two wires to heat and melt the at least one starting material at the leading tips for providing a stream of liquid droplets traveling in a predetermined direction.

20. The method of claim 19, wherein the twin arc spray process further includes operating a high energy source for producing a vaporizing zone adjacent to the arc and inside the reaction chamber wherein the liquid droplets are vaporized to form vapor species.

* * * * *